United States Patent
Itoh et al.

(10) Patent No.: US 10,879,451 B2
(45) Date of Patent: Dec. 29, 2020

(54) MAGNETIC TUNNEL JUNCTION DEVICE AND MAGNETIC RESISTANCE MEMORY DEVICE

(71) Applicant: Samsung Electronics Co., Ltd., Suwon-si (KR)

(72) Inventors: Hiroyoshi Itoh, Yokohama (JP); Yoshiaki Sonobe, Yokohama (JP)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/536,543

(22) Filed: Aug. 9, 2019

(65) Prior Publication Data
US 2020/0058846 A1    Feb. 20, 2020

(30) Foreign Application Priority Data

Aug. 14, 2018 (JP) .................... 2018-152614
Apr. 15, 2019 (KR) .................. 10-2019-0043817

(51) Int. Cl.
*H01L 43/02* (2006.01)
*H01L 43/10* (2006.01)
*H01L 27/22* (2006.01)

(52) U.S. Cl.
CPC ............ *H01L 43/02* (2013.01); *H01L 27/228* (2013.01); *H01L 43/10* (2013.01)

(58) Field of Classification Search
CPC ....... H01L 43/02; H01L 43/10; H01L 27/228; H01L 43/08
See application file for complete search history.

(56) References Cited

U.S. PATENT DOCUMENTS

| | | |
|---|---|---|
| 7,307,302 B2 | 12/2007 | Saito |
| 8,107,281 B2 | 1/2012 | Kai et al. |
| 8,686,521 B2 | 4/2014 | Daibou et al. |
| 9,065,039 B2 | 6/2015 | Park et al. |
| 2014/0084398 A1* | 3/2014 | Oguz .................... G11C 11/161 257/421 |
| 2014/0284534 A1* | 9/2014 | Nagase .................. H01L 43/12 257/1 |

(Continued)

FOREIGN PATENT DOCUMENTS

| | | |
|---|---|---|
| JP | 2005032878 | 2/2005 |
| JP | 2005150303 | 6/2005 |

(Continued)

OTHER PUBLICATIONS

Belmoubarik et al. "Epitaxial wurtzite-MgZnO barrier based magnetic tunnel junctions deposited on a metallic ferromagnetic electrode" Applied Physics Letters, 106:252403 6 pages (2015).

(Continued)

*Primary Examiner* — Victor A Mandala
(74) *Attorney, Agent, or Firm* — Myers Bigel, P.A.

(57) ABSTRACT

Disclosed is a magnetic tunnel junction device whose fixed layer has a simplified structure and in which the number of stacked layers is reduced. The magnetic tunnel junction device comprises a free layer whose magnetization direction is variable, a fixed layer whose magnetization direction is fixed and that is formed as a single layer, and a dielectric layer stacked between the free layer and the fixed layer. One or more of the free layer and the fixed layer are an $L1_1$ type magnetic alloy layer, and the dielectric layer has a (111) texture.

19 Claims, 5 Drawing Sheets

(56) References Cited

U.S. PATENT DOCUMENTS

2016/0308112 A1* 10/2016 Tan ...................... H01L 27/222

FOREIGN PATENT DOCUMENTS

JP          2010238769          10/2010
JP          2011071352           4/2011

OTHER PUBLICATIONS

Kamada et al. "Perpendicular Magnetic Anisotropy of Co2FexMn1—xSi Heusler Alloy Ultra-Thin Films" IEEE Transactions on Magnetics, 50:11 4 pages (2014).

Takamura et al. "Full-Heusler Co2FeSi alloy thin films with perpendicular magnetic anisotropy induced by MgO-interfaces" Journal of Applied Physics, 115:17C732 3 pages (2014).

Kataoka et al. "New High Density Recording Technology: High Ku, Magnetic Materials" 83:4 6 pages (2010).

* cited by examiner

MAGNETIC TUNNEL JUNCTION DEVICE AND MAGNETIC RESISTANCE MEMORY DEVICE

CROSS-REFERENCE TO RELATED APPLICATIONS

This U.S. nonprovisional application claims priority under 35 U.S.C § 119 to Japanese Patent Application No. 2018-152614 filed on Aug. 14, 2018, in the Japanese Intellectual Property Office, and Korean Patent Application No. 10-2019-0043817 filed on Apr. 15, 2019, in the Korean Intellectual Property Office, the entire contents of each of which are hereby incorporated by reference.

BACKGROUND

The present inventive concepts relate to a magnetic tunnel junction devices and magnetic resistance memory devices.

A magnetic resistance device having perpendicular magnetization is regarded as a next-generation memory because it can be operated using a magnetoresistance effect and may have excellent resistance to heat disturbance caused by fine patterns.

Such a next-generation memory may include a magnetic tunnel junction (MTJ) device having a free layer (also called a memory layer) whose magnetization direction is variable, a fixed layer (also called a reference layer) whose magnetization direction is fixed, and a dielectric layer (tunnel barrier) between the free layer and the fixed layer.

A spin polarization magnetic layer, which is a primary constituent of the next-generation memory, may utilize a ferromagnetic material having high perpendicular magnetic anisotropy and high spin polarizability. However, there are few materials that themselves have perpendicular magnetic anisotropy and experimentally high spin polarizability. Moreover, an alloy of cobalt-iron-boron (CoFeB) using interfacial magnetic anisotropy is a candidate for the material having perpendicular magnetic anisotropy and high spin polarizability, and the material selection range is extremely narrow.

An alloy of CoFeB has been developed as a spin polarization magnetic layer. Japanese Patent Publication No. (20)10-238769 ("Patent Document 1") discloses a magnetic tunnel junction device in which a spin polarization magnetic layer is in contact with a spacer layer whose lattice constant is less than that of the spin polarization magnetic layer such that a crystal lattice of the spin polarization layer is reduced in x-axis and y-axis directions.

Because the material itself does not have high perpendicular magnetic anisotropy, Patent Document 1 uses a fixed layer to which is attached a perpendicular magnetization preserving layer. In many studies, the perpendicular magnetization preserving layer is composed of $L1_0$ type iron-palladium (FePd), iron-platinum (FePt), cobalt-palladium (CoPd), or cobalt-platinum (CoPt) that have a (001) texture, a Co/Pd multi-layer (a layer in which Co and Pd are stacked in a (001) axis direction), or a Co/Pt multi-layer (a layer in which Co and Pt are stacked in a (001) axis direction), and thus formed as a ferromagnetic substance whose magnetic easy axis is oriented in a vertical direction to the surface of a layer.

Moreover, the fixed layer may be configured to include a perpendicular magnetization preserving layer combined with a ferromagnetic material (e.g., CoFeB) having high spin polarizability. In addition, the magnetic tunnel junction device having the fixed layer and the free layer composed of an alloy of CoFeB has a (001) texture so as to obtain a high tunnel magnetoresistance (TMR) effect from a relationship of a band structure between the dielectric, free, and fixed layers.

For example, a magnesium oxide (MgO) layer having the (001) texture is used as the dielectric layer of the magnetic tunnel junction device of Patent Document 1, and the (001) texture may also be provided to a base layer that improves orientation of the perpendicular magnetization preserving layer. Basically, the magnetic tunnel junction has the (001) texture.

As such, the magnetic tunnel junction device disclosed in Patent Document 1 problematically has an increased thickness caused by a complicated structure of the fixed layer.

In addition, because the free layer of the device disclosed in Patent Document 1 may have a small perpendicular magnetic anisotropy, the magnetic tunnel junction device is disadvantageous with respect to thermal stability and high densification. Meanwhile, studies have been conducted on a magnetic material, manganese gallium (MnGa) or Mn—Ge such as manganese germanium (MnGe), which itself has high perpendicular magnetic anisotropy. However, there is a problem indicated in these studies with respect to obtaining a high tunnel magnetoresistance effect.

SUMMARY

According to example embodiments of the present inventive concepts, a magnetic tunnel junction device comprises a free layer whose magnetization direction is variable, a fixed layer whose magnetization direction is fixed and that is formed as a single layer, and a dielectric layer stacked between the free layer and the fixed layer. One or more of the free layer and the fixed layer are an $L1_1$ type magnetic alloy layer, and the dielectric layer has a (111) texture.

According to example embodiments of the present inventive concepts, a magnetic tunnel junction device includes a memory layer comprising a variable magnetization direction, a reference layer comprising a fixed magnetization direction, and a barrier layer comprising a crystal orientation along a (111) plane between the memory layer and the reference layer.

According to example embodiments of the present inventive concepts, a magnetic resistance memory device includes a magnetic tunnel junction device comprising a free layer whose magnetization direction is variable, a fixed layer whose magnetization direction is fixed and that is formed as a single layer, and a dielectric layer between the free layer and the fixed layer, one or more of the free layer and the fixed layer being an $L1_1$ type magnetic alloy layer, the dielectric layer comprising a (111) texture, and an electrode configured to provide the magnetic tunnel junction device with a voltage.

BRIEF DESCRIPTION OF THE DRAWINGS

The inventive concepts will become more apparent in view of the attached drawings and accompanying detailed description.

DETAILED DESCRIPTION

The following will now describe some example embodiments of the present inventive concepts in conjunction with the accompanying drawings.

Figure 1:
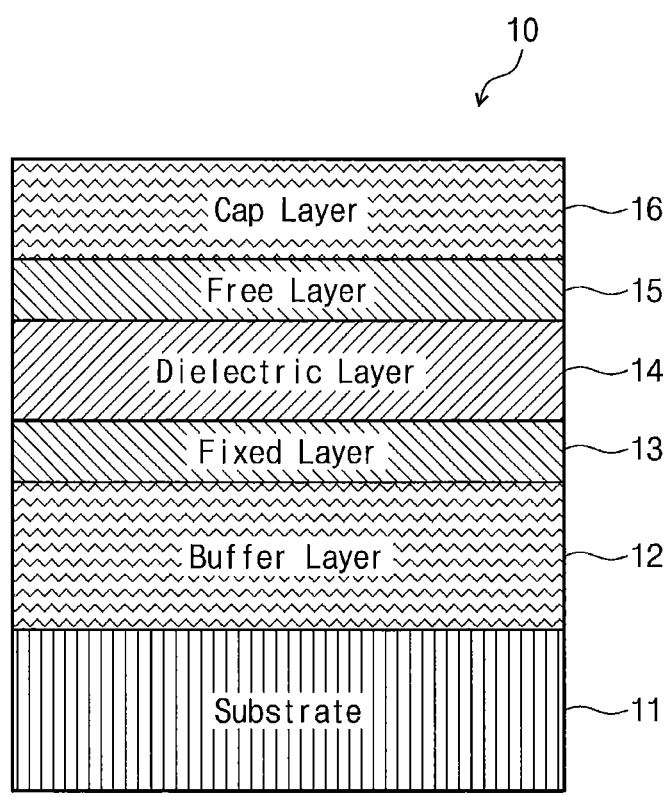
FIG. 1 illustrates a simplified cross-sectional view showing a configuration of a magnetic tunnel junction device according to embodiments of the inventive concepts.

FIG. 1 illustrates a simplified cross-sectional view showing a configuration of a magnetic tunnel junction device according to embodiments of the inventive concepts. A magnetic tunnel junction device 10 includes a substrate 11, a buffer layer 12, a fixed layer 13, a dielectric layer 14, a free layer 15, and a cap layer 16.

The substrate 11 may be, for example, a silicon (Si) substrate. For example, the substrate 11 may be a (111) substrate (e.g., the surface of the substrate 11 may be the (111) plane as denoted by a Miller index). The substrate 11 may be a Si substrate having a thermal oxide layer thereon or a single crystalline Si substrate.

Conventional notation known in the art of crystallography as Miller indices will be used herein to describe the crystal orientation of various layers. Miller indices, as is known in the art, indicate the arrangement of atoms in a crystalline solid. More specifically, Miller indices describe arrangements of atoms in a crystalline solid in terms of directions and planes in a crystal lattice. Miller indices are sets of three integers h, k, and l that describe a family of planes in a crystal lattice. The integers are written in their lowest terms, i.e., as their minimum integer ratio such that their greatest common divisor is 1. When the three integers are arranged in ( ) like (h k l), the index denotes the reciprocals of intercepts of the plane in a coordinate system of a unit cell of the crystal lattice. This plane could be any one of planes parallel to each other in the lattice.

The buffer layer 12 may be a stabilization layer formed on the substrate 11. For example, the buffer layer 12 may include ruthenium (Ru).

The fixed layer 13 may cause a magnetization direction to fix in a certain direction. The fixed layer 13 may be an $L1_1$ type magnetic alloy layer. The fixed layer 13 may be selected from a material whose magnetization direction does not easily change relative to the free layer 15. However, the material constituting the fixed layer 13 is not especially limited thereto, but may be selected from arbitrary materials.

For example, the fixed layer 13 may include an $L1_1$ type alloy. In particular, the fixed layer 13 may include an $L1_1$ type alloy of (Co—Ni)Pt. For example, the fixed layer 13 may include an $L1_1$ type alloy of $Co_{0.5}Ni_{0.5}Pt$. The fixed layer 13 may include $Fe_{0.5}Ni_{05}Pt$, $Co_{0.5}Fe_{0.5}Pt$, NiPt, FePt, or CoPt. In some embodiments, an atomic ratio of the $L1_1$ type alloy may be changed. When the fixed layer 13 is configured as discussed above, the fixed layer 13 may be formed as a single layer (e.g., a uniform layer) whose magnetization direction is fixed in a certain direction. The fixed layer 13 may also be referred to as a reference layer.

The dielectric layer 14 may be a layer whose main constituent is an insulating material. The dielectric layer 14 may have a (111) texture. As used herein, a texture of a layer refers to a predominant crystallographic alignment of the grain structure of the layer. Although grain alignments may differ slightly through a layer, the texture of the layer is defined by the predominant grain alignment. The dielectric layer 14 is stacked between the free layer 15 and the fixed layer 13 having ferromagnetic properties. The dielectric layer 14 may include MgO or $MgAl_2O_4$. When a voltage is applied in a vertical direction relative to a contact surface between the fixed layer 13 and the free layer 15, a tunnel effect allows a current to flow through the magnetic tunnel junction device 10. The dielectric layer 14 may also be referred to as a barrier layer.

The free layer 15 may be a layer whose magnetization direction is variable. As used herein, a variable magnetization direction refers to a magnetization direction that may vary according to a program current. The free layer 15 may be an $L1_1$ type magnetic alloy layer. For example, the free layer 15 may include an $L1_1$ type ordered alloy. In particular, the free layer 15 may include an $L1_1$ type ordered alloy of (Co—Ni)Pt. For example, the free layer 15 may include an $L1_1$ type alloy of $Co_{0.5}Ni_{0.5}Pt$. In some embodiments, the free layer 15 may include $Fe_{0.5}Ni_{0.5}Pt$, $Co_{0.5}Fe_{0.5}Pt$, NiPt, FePt, and/or CoPt. In some embodiments, an atomic ratio of the $L1_1$ type magnetic alloy may be changed. When the free layer 15 is configured as discussed above, the free layer 15 may be formed as a single layer whose magnetization direction is variable. The free layer 15 may also be referred to as a memory layer.

The cap layer 16 may be a stabilization layer formed on the free layer 15. For example, the cap layer 16 may include Ru.

Figure 2:
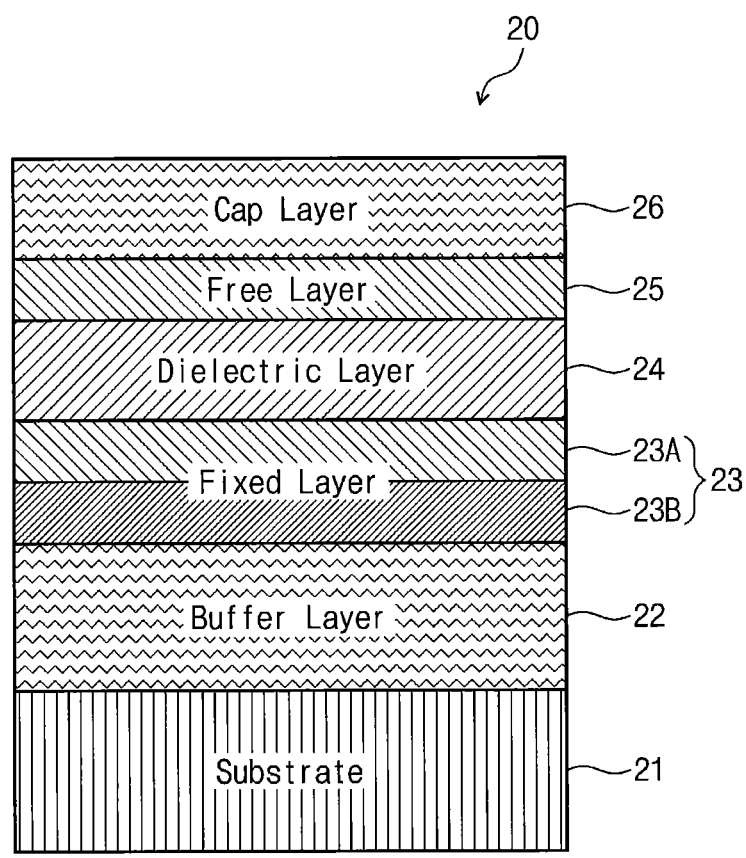
FIG. 2 illustrates a simplified cross-sectional view showing a configuration of a magnetic tunnel junction device according to a comparative example.

The magnetic tunnel junction device 10 of FIG. 1 is achieved as discussed above. The following will compare the embodiment illustrated in FIG. 1 with a structure of a conventional magnetic tunnel junction device. FIG. 2 illustrates a simplified cross-sectional view showing a configuration of a magnetic tunnel junction device according to a comparative example.

Referring to FIG. 2, a magnetic tunnel junction device 20 may include a substrate 21, a buffer layer 22, a high spin polarization magnetic layer 23A, a perpendicular magnetization preserving layer 23B, a dielectric layer 24, a free layer 25, and a cap layer 26. The fixed layer 23 may be formed to include the high spin polarization magnetic layer 23A and the perpendicular magnetization preserving layer 23B. The high spin polarization magnetic layer 23A may be composed of a Co-based Heusler alloy, but the material itself has no perpendicular magnetic anisotropy. Therefore, the high spin polarization magnetic layer 23A may be combined with the perpendicular magnetization preserving layer 23B and thus may serve as a fixed layer of the magnetic tunnel junction device 20. Perpendicular magnetization preserving layers are discussed in U.S. Pat. No. 9,065,039, the entire contents of which are herein incorporated by reference.

Compared to the comparative example, the magnetic tunnel junction device 10 of the embodiment illustrated in FIG. 1 uses an $L1_1$ type magnetic alloy layer as the fixed layer 13, and thus the fixed layer 13 may be formed as a single layer having high spin polarizability and high perpendicular magnetic anisotropy as well. Accordingly, in contrast to the magnetic tunnel junction device 20 of the comparative example in which the fixed layer 23 is formed into a multi-layer composed of the high spin polarization magnetic layer 23A and the perpendicular magnetization preserving layer 23B, the magnetic tunnel junction device 10 of FIG. 1 has no requirement to form the fixed layer 13 using multiple layers.

The following will describe a band structure of the magnetic tunnel junction device 10 of the embodiment illustrated in FIG. 1.

Figure 3:
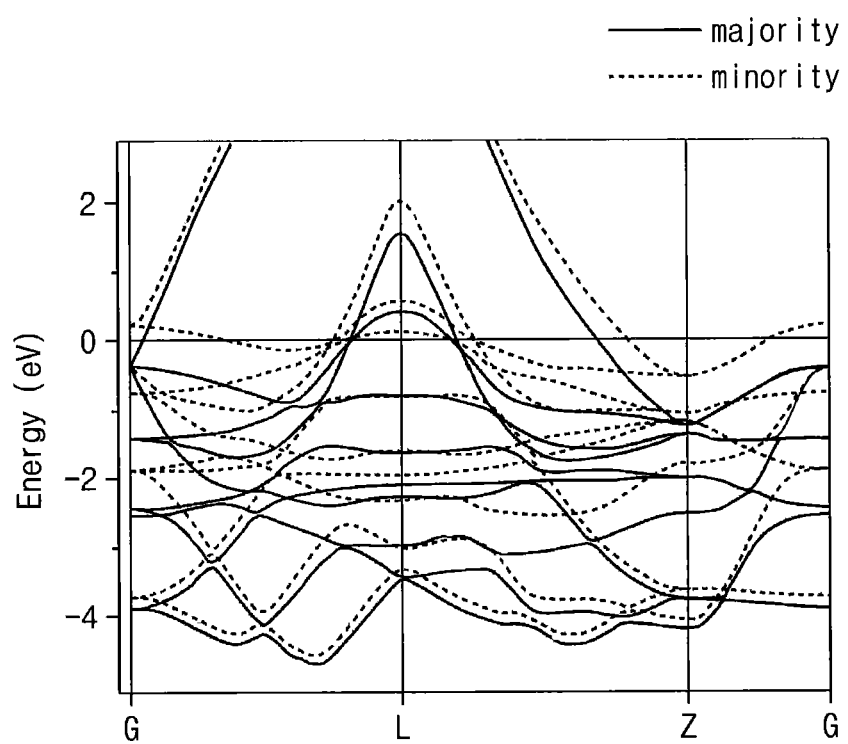
FIG. 3 illustrates a graph showing a band structure of nickel-platinum (NiPt) used for a spin polarization magnetic layer (or fixed layer) of a magnetic tunnel junction device according to the embodiment illustrated in FIG. 1.

FIG. 3 illustrates a graph showing a band structure of NiPt used for a spin polarization magnetic layer (e.g., the fixed layer 13) of the magnetic tunnel junction device 10 according to the embodiment illustrated in FIG. 1. In FIG. 3, the vertical axis represents an energy level (eV), and the horizontal axis denotes a wave vector (k) of an electron. FIG. 3 shows a band structure of an example in which an $L1_1$ type magnetic alloy of NiPt is used as the fixed layer 13. In FIG. 3, both majority and minority spin of the electron are illustrated.

FIG. 3 shows the band structure of an $L1_1$ type magnetic alloy of NiPt. According to first-principles calculation results, the $L1_1$ type magnetic alloy of NiPt becomes half metallic (e.g., spin polarizability of 100%) in a (111) direction, or between G-Z of FIG. 3, with the result that a high tunnel magnetoresistance effect may be expected. The $L1_1$ type magnetic alloy of NiPt exhibits high perpendicular magnetic anisotropy of $10^6$ J/m$^3$.

As such, the magnetic tunnel junction device 10 may have high perpendicular magnetic anisotropy and may also obtain high spin polarizability.

Further, a lattice constant matching may be considered so as to configure a magnetic tunnel junction device. Table 1 shows a lattice misfit (e.g., mismatch) using a lattice constant of an alloy. In Table 1, the lattice misfit is expressed by a ratio obtained when a difference in lattice constant between an $L1_1$ structured NiPt alloy and Ru, MgO or MgAl$_2$O$_4$ is divided by the lattice constant of the $L1_1$ structured NiPt alloy.

TABLE 1

| Material | Lattice Constant ($10^{-10}$ m) | Misfit (%) |
| --- | --- | --- |
| $L1_1$ NiPt | 3.79 | 0 |
| Ru | 3.81 | 1.8 |
| MgO | 4.21 | 11.0 |
| MgAl$_2$O$_4$ | 4.04 | 6.6 |

As shown in Table 1, a magnitude of the lattice misfit is sufficiently small enough to stack $L1_1$ type NiPt on Ru, MgO, or MgAl$_2$O$_4$.

As discussed above, according to the magnetic tunnel junction device 10, when the fixed layer 13 is formed of an $L1_1$ type magnetic alloy and the dielectric layer 14 is formed to have a (111) texture, the fixed layer 13 may be formed as a single layer whose magnetization direction is fixed in a certain direction.

In addition, according to the magnetic tunnel junction device 10, the fixed layer 13 may be formed as a single layer that includes no perpendicular magnetization preserving layer and fixes a magnetization direction in a certain direction. Therefore, it may be possible to simplify a structure of the magnetic tunnel junction device 10 and in turn to reduce the number of stacked layers in the magnetic tunnel junction device 10. In addition, the magnetic tunnel junction device 10 may have a decreased thickness.

Moreover, when the free layer 15 is formed of an $L1_1$ type magnetic alloy and the dielectric layer 14 is formed to have a (111) texture, the free layer 15 may be formed as a single layer whose magnetization direction is variable.

Furthermore, when one or more of the free layer 15 and the fixed layer 13 are formed of an $L1_1$ type magnetic alloy, and when the dielectric layer 14 is formed to have a (111) texture, it may be possible to fabricate the magnetic tunnel junction device 10 having a lesser number of stacked layers and to stabilize a crystal structure of the magnetic tunnel junction device 10. As a result, atoms may be prevented from diffusing in the magnetic tunnel junction device 10.

The magnetic tunnel junction device 10 may also have good thermal stability and high densification.

According to the magnetic tunnel junction device 10, amounts of Ni and Co may be controlled to reduce saturation magnetization (Ms), and accordingly, to change the magnetization direction at high speeds.

The following will describe an embodiment of the inventive concepts in which MgAl$_2$O$_4$ is used as the dielectric layer 14.

Figure 4:
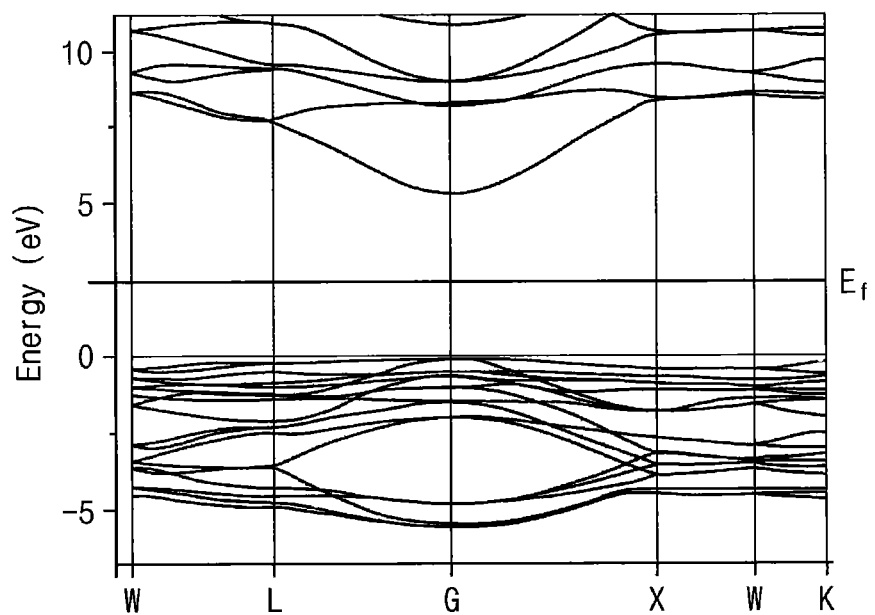
FIG. 4 illustrates a graph showing a band structure of $MgAl_2O_4$ used for a barrier layer of a magnetic tunnel junction device according to embodiments of the inventive concepts.

FIG. 4 illustrates a graph showing a band structure of MgAl$_2$O$_4$ used for a barrier layer (e.g., dielectric layer 14) of the magnetic tunnel junction device 10 according to embodiments of the inventive concepts. In FIG. 4, the vertical axis represents an energy level (eV), the horizontal axis denotes a wave vector (k) of an electron, and $E_f$ denotes the Fermi level. FIG. 4 illustrates a band structure of an example in which MgAl$_2$O$_4$ is used as the dielectric layer 14. In some embodiments, the MgAl$_2$O$_4$ layer may have a (111) texture.

As shown in FIG. 4, MgAl$_2$O$_4$ is a direct gap insulator at the point of G, and filters only electrons that vertically travel toward the dielectric layer 14 or in a (111) direction. Thus, the magnetic tunnel junction device 10 according to the inventive concepts using MgAl$_2$O$_4$ as the dielectric layer 14 may obtain a high tunnel magnetoresistance effect and high spin polarizability resulting from use of a half metallic material in the (111) direction, as shown in FIG. 3, as a spin polarization layer.

As such, a higher tunnel magnetoresistance effect may be expected because the lattice misfit can be reduced.

In the description that follows, a magnetic resistance memory device using the magnetic tunnel junction device 10 of the inventive concepts will be described.

Figure 5:
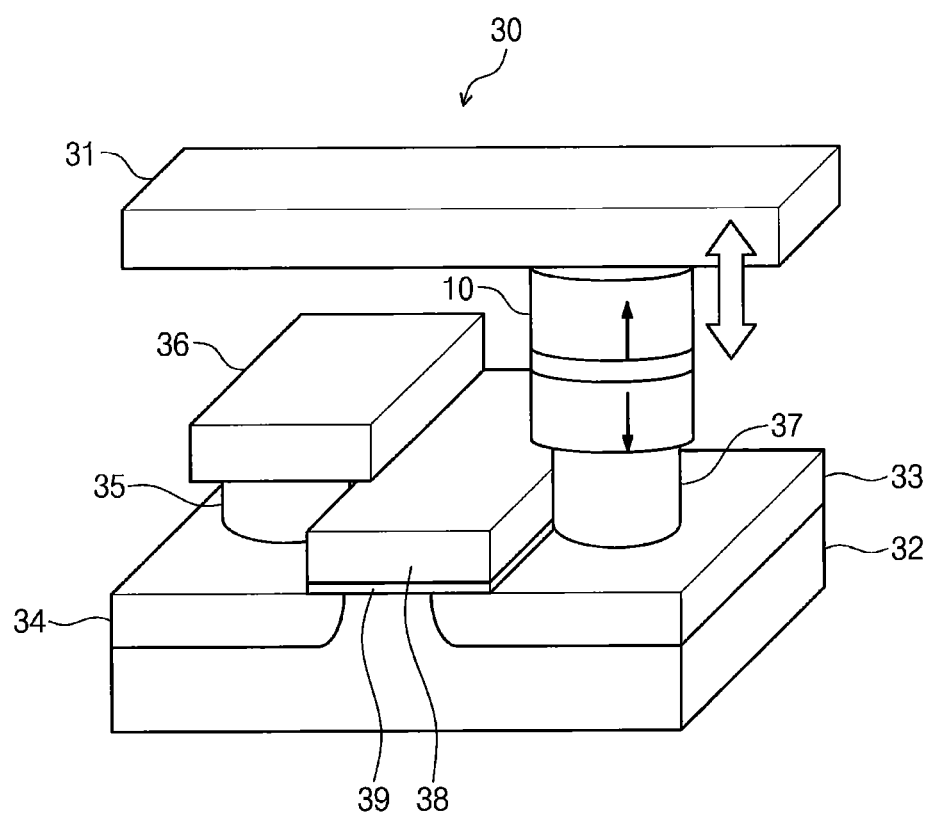
FIG. 5 illustrates a perspective view showing a portion of a magnetic resistance memory device according to embodiments of the inventive concepts.

FIG. 5 illustrates a perspective view showing a portion of a magnetic resistance memory device according to embodiments of the inventive concepts.

Referring to FIG. 5, a magnetic resistance memory device may include a memory cell 30, a bit line 31, contact plugs 35 and 37, and a word line 38.

The memory cell 30 may include a semiconductor substrate 32, diffusion regions 33 and 34, a source line 36, a gate dielectric layer 39, and a magnetic tunnel junction device 10. The magnetic tunnel junction device 10 of FIG. 5 may correspond, for example, to the magnetic tunnel junction device 10 described herein with respect to FIGS. 1, 3, and 4.

The magnetic resistance memory device may be formed by placing a plurality of memory cells 30 in a matrix shape and using a plurality of bit lines 31 and a plurality of word lines 38 to connect the plurality of memory cells 30 to each other. The magnetic resistance memory device (e.g., magnetoresistive random access memory (MRAM)), may use a spin torque injection method to perform a data writing operation.

The semiconductor substrate 32 may have the diffusion regions 33 and 34 on a surface thereof. The diffusion region 33 may be disposed spaced apart at a certain interval from the diffusion region 34. The diffusion region 33 may act as a drain region, and the diffusion region 34 may act as a source region. The diffusion region 33 may be coupled through the contact plug 37 to the magnetic tunnel junction device 10.

The bit line 31 may be disposed on the semiconductor substrate 32 and may be coupled to the magnetic tunnel junction device 10. The bit line 31 may be coupled to a write circuit (not shown) and/or a read circuit (not shown).

The diffusion region 34 may be coupled through the contact plug 35 to the source line 36. The source line 36 may be coupled to the write circuit (not shown) and/or the read circuit (not shown).

The word line 38 may be adjacent to the diffusion region 33 and the diffusion region 34, and may be disposed on the semiconductor substrate 32 with the gate dielectric layer 39 interposed therebetween. The word line 38 and the gate dielectric layer 39 may serve as a selection transistor. The selection transistor may be turned on when a current is supplied to by a circuit (not shown).

When the magnetic tunnel junction device 10 is supplied with a voltage through the bit line 31 and the diffusion region 33 that serve as electrodes, a magnetization direction of a ferromagnetic layer of the magnetic tunnel junction device 10 may be switched by electron spin torques aligned in a specific direction. A change of current direction may alter values of data stored in the magnetic resistance memory device.

As discussed above, the magnetic resistance memory device may be configured such that no perpendicular magnetization preserving layer is included, and that a single layer is adopted to fix a magnetization direction in a certain direction. Therefore, the magnetic resistance memory device according to some example embodiments may simplify a structure of the fixed layer and reduce the number of stacked layers of the magnetic tunnel junction device 10.

Moreover, according to the magnetic resistance memory device of the inventive concepts, it may be possible to obtain good thermal stability of the magnetic tunnel junction device 10 and to achieve high densification of the magnetic resistance memory device.

The present inventive concepts are not limited to those discussed above, and modifications can be made without departing from the scope of the present inventive concepts. For example, in the magnetic tunnel junction device 10, a (111) plane contact may be present between the dielectric layer 14 and one of the fixed layer 13 and the free layer 15. In the magnetic tunnel junction device 10, the (111) plane contact may be present between the fixed layer 13 and the dielectric layer 14 and between the free layer 15 and the dielectric layer 14. The dielectric layer 14 may include one of $MgGa_2O_4$, $ZnAl_2O_4$, and $ZnGa_2O_4$ that have the (111) texture.

According to a magnetic tunnel junction device and a magnetic resistance memory device of the present inventive concepts, the magnetic tunnel junction device may include a fixed layer whose structure is simplified and stacked layers whose stack number is reduced.

According to some example embodiments of the present inventive concepts, a magnetic tunnel junction device may comprise: a free layer whose magnetization direction is variable; a fixed layer whose magnetization direction is fixed in a certain direction and which is formed as a single layer; and a dielectric layer stacked between the free layer and the fixed layer. One or more of the free layer and the fixed layer may be an $L1_1$ type magnetic alloy layer, and the dielectric layer may have a (111) texture.

In certain embodiments, the magnetic tunnel junction device may not include a perpendicular magnetization preserving layer or a spacer layer. A single spin polarization magnetic layer may be used to fix a magnetization direction in a certain direction. Accordingly, the magnetic tunnel junction device may have a simplified structure of the fixed layer, and thus may reduce the number of stacked layers thereof.

The dielectric layer of the magnetic tunnel junction device may include one of MgO, magnesium aluminate ($MgAl_2O_4$), magnesium gallate ($MgGa_2O_4$), zinc aluminate ($ZnAl_2O_4$), and zinc gallate ($ZnGa_2O_4$) that have the (111) texture.

In certain embodiments, the magnetic tunnel junction device may have a high tunnel magnetoresistance effect and high perpendicular magnetic anisotropy.

In certain embodiments, the magnetic tunnel junction device may further include a base layer having the (111) texture.

According to the magnetic tunnel junction device in accordance with certain embodiments, because a coordination number is greater for a (111) plane than for a (001) plane, in-plane bonding may be strong to stabilize a crystal structure and to prevent diffusion of atoms.

In some embodiments, the fixed layer of the magnetic tunnel junction layer may not include a perpendicular magnetization preserving layer or a spacer layer.

In certain embodiments, the magnetic tunnel junction device may decrease in thickness.

According to some example embodiments of the present inventive concepts, a magnetic resistance memory device may comprise a magnetic tunnel junction device and an electrode that provides the magnetic tunnel junction device with a voltage. The magnetic tunnel junction device may include: a free layer whose magnetization direction is variable; a fixed layer whose magnetization direction is fixed in a certain direction and which is formed as a single layer; and a dielectric layer stacked between the free layer and the fixed layer. One or more of the free layer and the fixed layer may be an $L1_1$ type magnetic alloy layer, and the dielectric layer may have a (111) texture In certain embodiments, the magnetic resistance memory device may not include a perpendicular magnetization preserving layer or a spacer layer. The magnetic resistance memory device may use a single polarization magnetic layer to fix a magnetization direction in a specific direction. Accordingly, the magnetic resistance memory device may have a simplified structure of the fixed layer, and thus may reduce the number of stacked layers of the magnetic tunnel junction device

What is claimed is:

1. A magnetic tunnel junction device, comprising:
    a free layer whose magnetization direction is variable;
    a fixed layer whose magnetization direction is fixed and that is formed as a single layer; and
    a dielectric layer stacked between the free layer and the fixed layer,
    wherein one or more of the free layer and the fixed layer are an $L1_1$ type magnetic alloy layer, and
    wherein the dielectric layer has a (111) texture.

2. The magnetic tunnel junction device of claim 1, wherein the dielectric layer includes one of MgO, $MgAl_2O_4$, $MgGa_2O_4$, $ZnAl_2O_4$, and $ZnGa_2O_4$.

3. The magnetic tunnel junction device of claim 2, wherein the fixed layer is free of a perpendicular magnetization preserving layer.

4. The magnetic tunnel junction device of claim 1, wherein the fixed layer is free of a perpendicular magnetization preserving layer.

5. The magnetic tunnel junction device of claim 1, wherein a (111) plane of the dielectric layer is in contact with one of the fixed layer and the free layer.

6. The magnetic tunnel junction device of claim 1, wherein the fixed layer comprises $L1_1$ structured NiPt alloy.

7. The magnetic tunnel junction device of claim 1, wherein the fixed layer comprises an $L1_1$ type alloy of one of NiPt, FePt, and CoPt.

8. The magnetic tunnel junction device of claim 1, further comprising a substrate having a (111) crystal orientation,
wherein the fixed layer is on the substrate.

9. A magnetic tunnel junction device, comprising:
a memory layer comprising a variable magnetization direction;
a reference layer comprising a fixed magnetization direction; and
a barrier layer comprising a crystal orientation along a (111) plane between the memory layer and the reference layer,
wherein one or more of the memory layer and the reference layer are an $L1_1$ type magnetic alloy layer.

10. The magnetic tunnel junction device of claim 9, wherein the barrier layer comprises one of MgO, $MgAl_2O_4$, $MgGa_2O_4$, $ZnAl_2O_4$, and $ZnGa_2O_4$.

11. The magnetic tunnel junction device of claim 9, wherein the reference layer is free of a perpendicular magnetization preserving layer.

12. The magnetic tunnel junction device of claim 9, further comprising a (111) plane contact between the barrier layer and one of the reference layer and the memory layer.

13. The magnetic tunnel junction device of claim 9, wherein the reference layer comprises $L1_1$ structured NiPt alloy.

14. The magnetic tunnel junction device of claim 9, wherein the reference layer comprises an $L1_1$ type alloy of one of NiPt, FePt, and CoPt.

15. The magnetic tunnel junction device of claim 9, further comprising a substrate having a (111) orientation,
wherein the reference layer is on the substrate.

16. A magnetic resistance memory device, comprising:
a magnetic tunnel junction device comprising a free layer whose magnetization direction is variable, a fixed layer whose magnetization direction is fixed and that is formed as a single layer, and a dielectric layer between the free layer and the fixed layer, one or more of the free layer and the fixed layer being an $L1_1$ type magnetic alloy layer, the dielectric layer comprising a (111) texture; and
an electrode configured to provide the magnetic tunnel junction device with a voltage.

17. The magnetic resistance memory device of claim 16, wherein the fixed layer comprises an $L1_1$ type alloy of one of NiPt, FePt, and CoPt.

18. The magnetic resistance memory device of claim 16, wherein the dielectric layer comprises one of MgO, $MgAl_2O_4$, $MgGa_2O_4$, $ZnAl_2O_4$, and $ZnGa_2O_4$.

19. The magnetic resistance memory device of claim 16, wherein a (111) plane of the dielectric layer is in contact with one of the fixed layer and the free layer.

* * * * *